US010705130B2

(12) United States Patent
Liu et al.

(10) Patent No.: US 10,705,130 B2
(45) Date of Patent: Jul. 7, 2020

(54) ADAPTIVE TRANSMITTER PRESENT DETECTION

(71) Applicant: Integrated Device Technology, Inc., San Jose, CA (US)

(72) Inventors: Rui Liu, Fremont, CA (US); Lijie Zhao, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 28 days.

(21) Appl. No.: 15/998,716

(22) Filed: Aug. 16, 2018

(65) Prior Publication Data

US 2019/0137554 A1 May 9, 2019

Related U.S. Application Data

(60) Provisional application No. 62/547,037, filed on Aug. 17, 2017.

(51) Int. Cl.
| | | |
|---|---|---|
| *G01R 29/02* | (2006.01) | |
| *H02J 50/12* | (2016.01) | |
| *H03K 3/01* | (2006.01) | |
| *H03K 5/135* | (2006.01) | |

(52) U.S. Cl.
CPC ............ *G01R 29/023* (2013.01); *H02J 50/12* (2016.02); *H03K 3/01* (2013.01); *H03K 5/135* (2013.01)

(58) Field of Classification Search
CPC ..................................................... H02J 50/12
See application file for complete search history.

(56) References Cited

U.S. PATENT DOCUMENTS

| | | | |
|---|---|---|---|
| 6,141,538 A | 10/2000 | Consolazio et al. | |
| 2013/0062959 A1 | 3/2013 | Lee et al. | |
| 2013/0062961 A1 | 3/2013 | Park et al. | |
| 2014/0350872 A1 | 11/2014 | Xu et al. | |
| 2015/0097438 A1 | 4/2015 | Aioanei | |
| 2016/0294227 A1 | 10/2016 | Podkamien et al. | |
| 2017/0025895 A1* | 1/2017 | Hayashida ............... | H02J 7/025 |
| 2017/0141604 A1* | 5/2017 | Park ......................... | H02J 7/025 |
| 2017/0237296 A1 | 8/2017 | Park et al. | |
| 2017/0264144 A1* | 9/2017 | Park ......................... | H02J 50/12 |
| 2018/0097408 A1* | 4/2018 | Oh ........................... | H02J 50/12 |
| 2018/0102669 A1* | 4/2018 | Son .......................... | H02J 7/025 |

OTHER PUBLICATIONS

International Search Report and Written Opinion issued by the International Searching Authority dated Dec. 20, 2018 for PCT Application No. PCT/US2018/00314. pp. 1-14.

* cited by examiner

*Primary Examiner* — Walter L Lindsay, Jr.
*Assistant Examiner* — Milton Gonzalez
(74) *Attorney, Agent, or Firm* — Haynes and Boone, LLP

(57) ABSTRACT

A method of adaptively operating a transmit detection circuit is presented. The method includes powering the transmit detection circuit with a capacitor charged by an LDO; receiving a digital ping signal from a transmitter; receiving a clock signal from a local oscillator; updating a register to accommodate timing of the digital ping signal; and generating a signal indicating whether the transmitter is present.

8 Claims, 4 Drawing Sheets

ADAPTIVE TRANSMITTER PRESENT DETECTION

RELATED APPLICATION

This application claims priority to U.S. Provisional Application Ser. No. 62/547,037, filed Aug. 17, 2017, which is herein incorporated by reference in its entirety.

TECHNICAL FIELD

Embodiments of the present invention are related to wireless power systems and, specifically, to providing transmitter present circuits.

DISCUSSION OF RELATED ART

Typically, a wireless power system includes a transmitter coil that is driven to produce a time-varying magnetic field and a receiver coil that is positioned relative to the transmitter coil to receive the power transmitted in the time-varying magnetic field. In some cases, the receiver detects the presence of the transmitter by detecting ping signals from the transmitter.

As described in the Wireless Power Consortium (WPC) standard, a transmitter will periodically provide a ping signal. When the receiver detects power from the ping signal, it can respond with a communications packet to the transmitter. After the ping signal from the transmitter has been responded to by the receiver, then the receiver and transmitter can enter an initialization stage to begin wireless power transfer.

Consequently, there is a need for better detection of the transmitter by the receiver in order to more efficiently initiate power transfer.

SUMMARY

In accordance with some embodiments of the present invention, a method of adaptively operating a transmit detection circuit is presented. The method includes powering the transmit detection circuit with a capacitor charged by an LDO; receiving a digital ping signal from a transmitter; receiving a clock signal from a local oscillator; updating a register to accommodate timing of the digital ping signal; and generating a signal indicating whether the transmitter is present.

A transmitter detection circuit can include a low-dropout regulator that is powered when a digital ping signal is present; a capacitor coupled to receive power from the low-dropout regulator and supply a voltage; a control logic coupled to receive the voltage; a timing circuit coupled to a register and supplying a digital ping timing signal to the control logic; a clock circuit coupled to provide a clock signal to the control logic; and a transistor coupled to the control logic, the transistor being set to drive an output signal to a first state indicating presence of the digital ping signal if the digital ping signal arrives prior to the digital ping timing signal, the transistor being set to drive the output signal to a second state indicating absence of the digital ping signal if the digital ping timing signal arrives without a digital ping signal.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
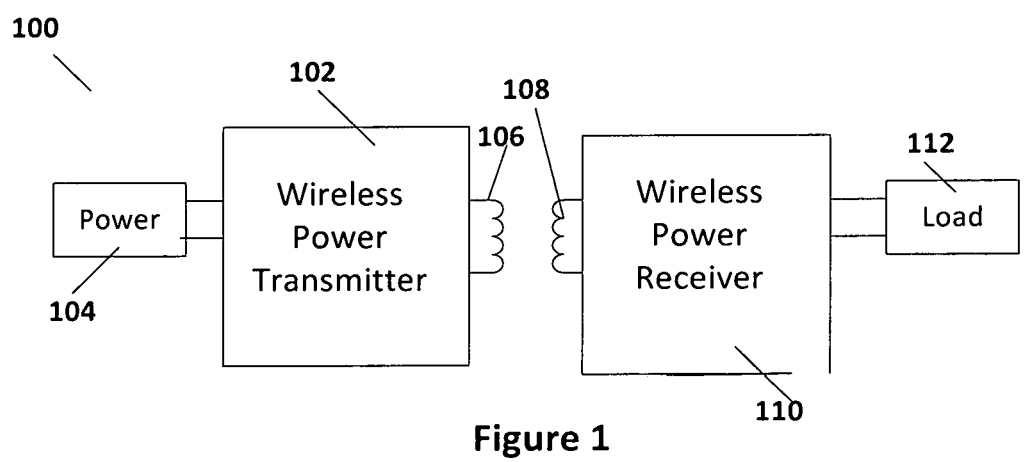
FIG. 1 illustrates a wireless power transmission system.

FIG. 1 illustrates a system 100 for wireless transfer of power. As illustrated in FIG. 1, a wireless power transmitter 102 drives a coil 106 to produce a magnetic field. A power supply 104 provides power to wireless power transmitter 102. Power supply 104 can be, for example, a battery based supply or may be powered by alternating current for example 120V at 60 Hz. Wireless power transmitter 102 drives coil 106 at, typically, a range of frequencies, usually according to one of the wireless power standards. However, this could be applicable to any frequency where it is practical to transfer power and/or information by powering magnetic coils regardless of any standard that may exist.

There are multiple standards for wireless transmission of power, including the Alliance for Wireless Power (A4WP) standard and the Wireless Power Consortium standard, the Qi Standard. Under the A4WP standard, for example, up to 50 watts of power can be inductively transmitted to multiple charging devices in the vicinity of coil 106 at a power transmission frequency of around 6.78 MHz. Under the Wireless Power Consortium (WPC), the Qi specification, a resonant inductive coupling system is utilized to charge a single device at the resonance frequency of the device. In the Qi standard, coil 108 is placed in close proximity with coil 106 while in the A4WP standard, coil 108 is placed near coil 106 along with other coils that belong to other charging devices. FIG. 1 depicts a generalized wireless power system 100 that operates under any of these standards. In Europe, the switching frequency has been limited to 148 kHz.

As is further illustrated in FIG. 1, the magnetic field produced by coil 106 induces a current in coil 108, which results in power being received in a receiver 110. Receiver 110 receives the power from coil 108 and provides power to a load 112, which may be a battery charger and/or other components of a mobile device. Receiver 110 typically includes rectification to convert the received AC power to DC power for load 112.

In some standards, for example, the WPC standard, transmitter 102 produces a ping signal periodically in order to search for the presence of a receiver such as wireless power receiver 110. In particular, a digital ping from transmitter 102 provides a power signal that can activate receiver 110. Once activated, receiver 110 can provide a response to transmitter 102. If transmitter 102 detects receiver 110, then transmitter 102 may extend the digital ping in order to proceed to an indentification and configuration phase. If the transmitter 102 does not receive a response, then transmitter 102 removes the digital ping signal and proceeds to a selection phase. Consequently, when transmitter 102 receives a ping signal, which can provide power to receiver 110, then power receiver 110 responds to the digital ping with a response first communications packet.

Figure 2A:
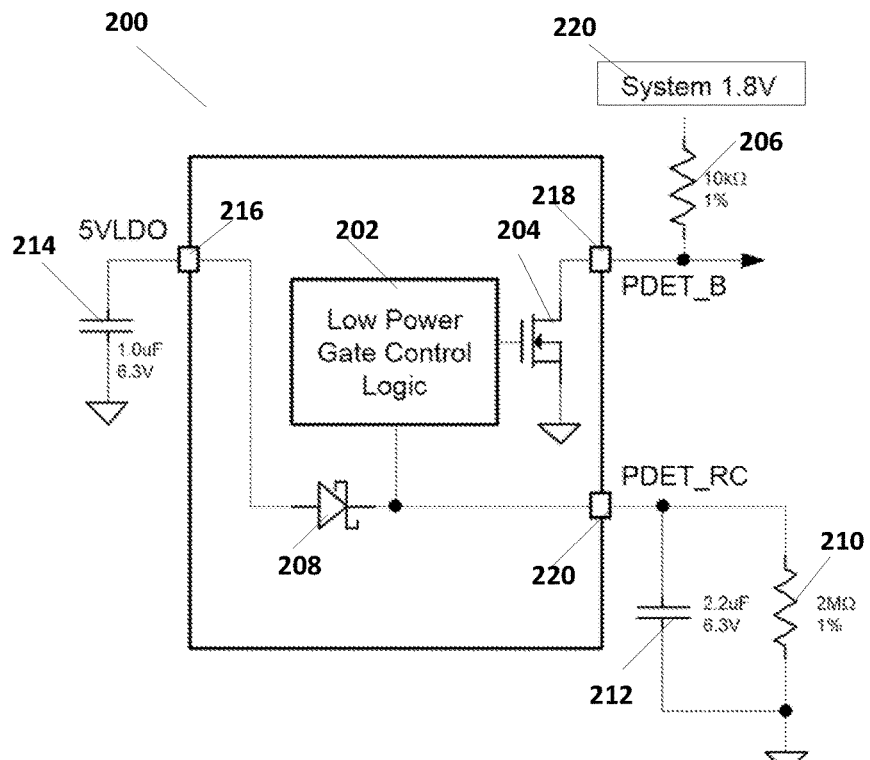
FIGS. 2A and 2B illustrate a conventional transmitter detection circuit.
Figure 2B:
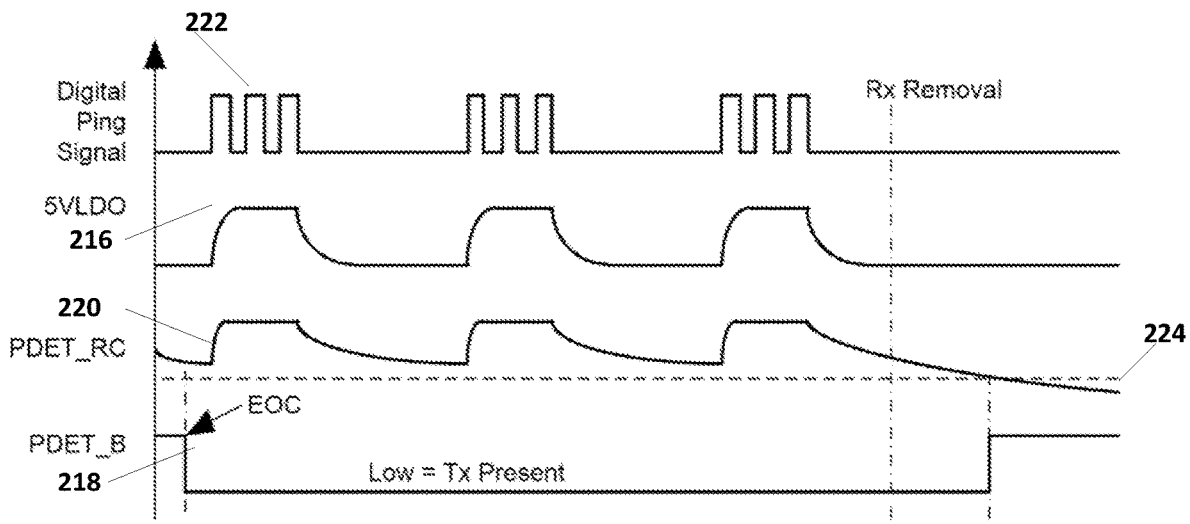

FIGS. 2A and 2B illustrate a conventional transmitter detection circuit 200 that can be part of receiver 110. As illustrated in FIG. 2A, the 5V low-dropout (LDO) regulator output 216 is coupled through capacitor 214 to ground. The 5V LDO output 216 is also coupled through a diode 208 to low power gate control logic 202 and to an RC output PDET_RC 220, which is coupled through series coupled capacitor 212 and resistor 210 to ground. Control logic 202 monitors the voltage at PDT_RC 220 and controls transistor 204 accordingly. Transistor 204 couples PDT_B output 218 to ground, otherwise PDT_B is coupled through pull-up resistor 206 to system voltage 220, which may be, for example, a 1.8V system voltage.

FIG. 2B illustrates waveforms appropriate to illustrate the operation of circuit 200. As illustrated in FIG. 2B, there is a pre-determined Tx digital ping time interval that can be received. FIG. 2B illustrates digital ping signal 222. As a result of the digital ping signal 222 illustrated in FIG. 2B, the 5VLDO output 216 is illustrated. The ramp-up and decay of output signal 216 is a result of the capacitance of capacitor 214 being charged and discharged as the digital ping signal 222 powers circuit 200. The output signal from diode 208, PDET_RC 220, is determined by the RC time constant of the parallel coupled capacitor 212 and resistor 210 pair. As a result, the charging of capacitor 212 combined with the decay determined by the RC time constant results in the signal PDT_RC 220 shown in FIG. 2B. As is illustrated FIG. 2B, control logic 202 turns on transistor 204 when PDET_RC 220 is activated and turns transistor 204 off when PDT_RC 220 is not activated. This is shown in the waveform of PDT_B 218 shown in FIG. 2B, where PDT_B 218 is low when transmitter 102 is present and providing a digital ping signal. When the value of PDET_RC 220 drops below a threshold 224, control logic 202 turns transistor 204 off.

However, the digital ping interval varies from one transmitter to another. To cover a wide range of Tx digital ping time intervals, the RC time constant resulting for parallel coupled capacitor 212 and resistor 210 that controls the time decal of the PDET_RC output signal 220 must be set long enough to accommodate any anticipated ping interval. As a consequence, the signal PDET_B 218, which indicates the presence of a transmitter 102 to other components of receiver 110, cannot actively reflect removal of transmitter 102 in a timely fashion. As illustrated in FIG. 2B, the absence of transmitter 102 is only detected after PDET_RC 220 drops below threshold 224, which may be a significant time after actual removal of transmitter 102.

Circuit 200 illustrated in FIG. 2A is very simple. However, the issue with the simplicity is that the detection time interval is a function of the external components resistor 210 and capacitor 212, as well as the MOSFET gate voltage threshold tolerance of transistor 204. The gate threshold voltage of transistor 204 may also be a function of ambient temperature. Tolerances for these components are generally very large. The result, as indicated in FIG. 2B, is that the signal PDET_B 218 indicates absence of the transmitter a significant time after remove of receiver 102 from transmitter 110.

To meet different digital ping intervals in circuit 200 in order to more accurately provide an indication of the removal of the transmitter, the RC value of the circuit formed by resistor 210 and capacitor 212 must be changed. Therefore digital ping interval time cannot be either adaptively set in real applications or be updated using manufacturer firmware through testing.

Figure 3A:
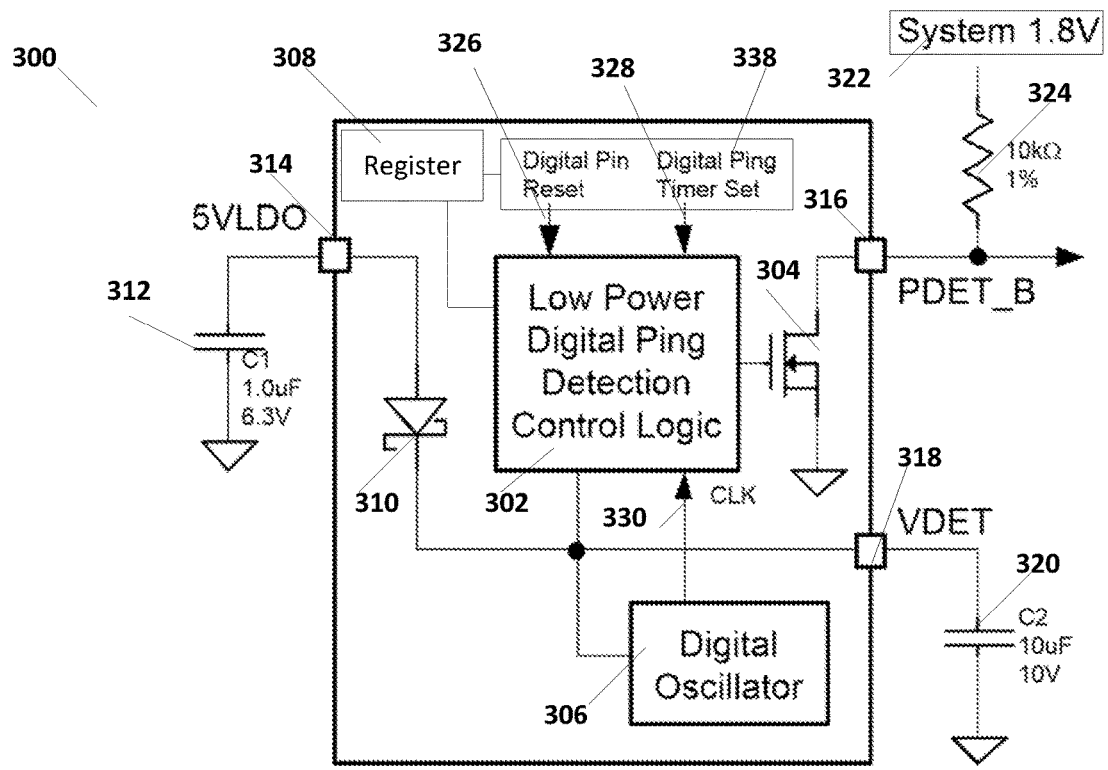
FIGS. 3A and 3B illustrate an adaptive transmitter detection circuit according to some embodiments of the present invention.

FIG. 3A illustrates a transmitter detection circuit 300 according to some embodiments of the present invention. As is illustrated in FIG. 3A, an LDO input 314 is coupled through capacitor 312 to ground to supply power. The power signal 314 is provided through diode 310 to provide power VDET 318 to a low power digital ping detection control logic 302 and to a low voltage digital oscillator 306. The supplied voltage VDET 318 is coupled through capacitor 320 to ground.

Digital oscillator 306 provides a clock signal CLK 330 to control logic 302. Control logic 302 controls transistor 304 according to the voltage VDET 318 as well as a digital pin reset signal 326 and a digital ping timer set signal 338. Transistor 304 can set the output signal PDET_B 316 to ground when a transmitter is detected or be set at a system voltage 322 through pull-up resistor 324 when no transmitter is detected.

Digital pin reset 326 and digital ping timer set in timing circuit 338 can be controlled by a register 308. Values stored in register 308 can be adaptively set from a factory-set default by control logic 302 so as to more accurately determine when the transmitter is removed.

Figure 3B:
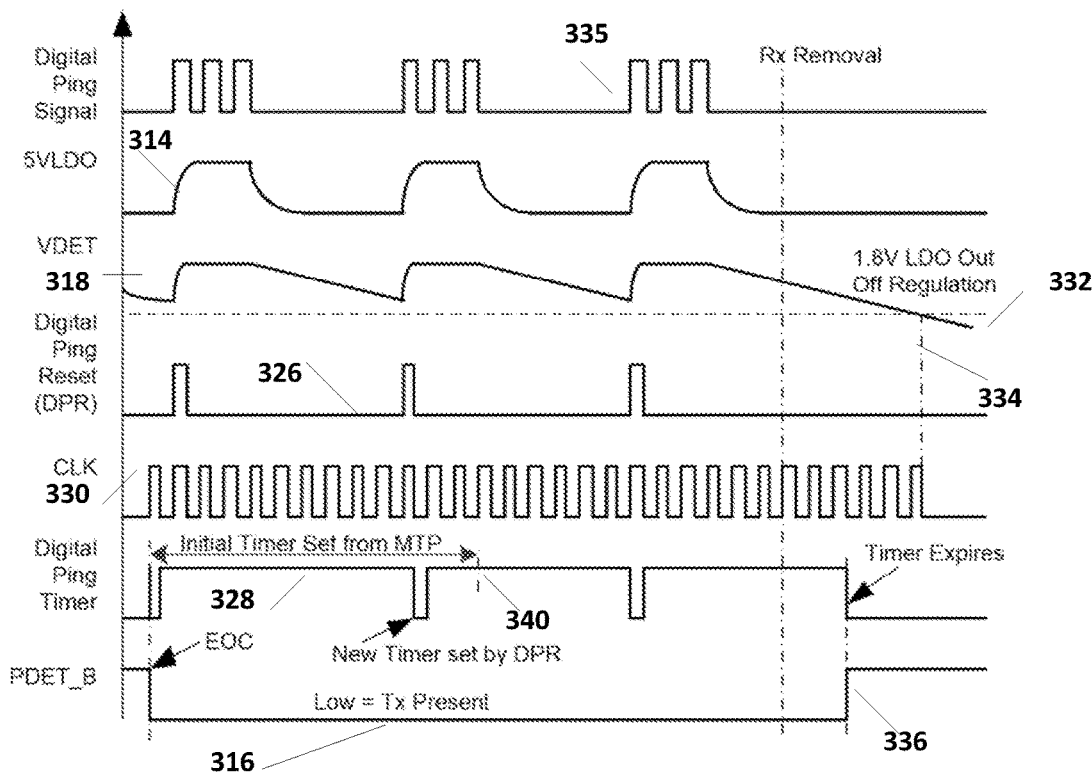

Waveforms for certain signals in circuit 300 are illustrated in FIG. 3B. As shown in FIG. 3A, an adaptive Tx detection circuitry 300 includes low power digital oscillator 306, low power digit logic circuit 302, and digital interval register or MTP memory 308 that can be set adaptively real time as well as at manufacturer testing. One external capacitor, C2 320, provides an energy storage device for the low power LDO power from LDO 314, which as shown may be a 5V LDO. As is illustrated, only one external capacitor 320 is used to supply the power to the low power oscillator, low power LDO, and low power digit logic circuit. Capacitor 320 is not involved in setting up the digital ping time interval detection timer, eliminating the effect of external component tolerance on detection accuracy. As is further illustrated in FIG. 3A, the signal PDET_B 316 is triggered by low power digit logic circuit 302. The MSOFET gate voltage threshold of transistor 304 is not involved in the trigger decision. Therefore the effect of MOSFET gate voltage threshold is removed. The digital ping time interval register or MTP memory 308 can be updated every time the receiver is placed on a new transmitter, eliminating the detection time error due to variation of different transmitter digital ping time intervals.

FIG. 3B illustrates relevant signals in circuit 300 as illustrated in FIG. 3A. A digital ping signal 334 is illustrated in FIG. 3B for reference. The LDO signal 314 and the resulting VDET signal 318 is shown. Digital ping reset signal 328 is also shown along with clock signal CLK 330. As illustrated in the digital ping timer 328, as has been adapted to the timing of the digital ping signal 334. The default timing 340 is also illustrated for comparison. The resulting output signal PDET_B 316 illustrates that the PDET_B is reset 336 after the digital ping timer has expired without receiving a new digital ping signal, rather than when the signal VDET 318 drops below a threshold value 332 at time 335. Consequently, the detection of the absence of the transmitter, by the absence of the digital ping signal, is much faster and closer to the actual removal of the transmitter from the presence of the receiver.

Figure 4:
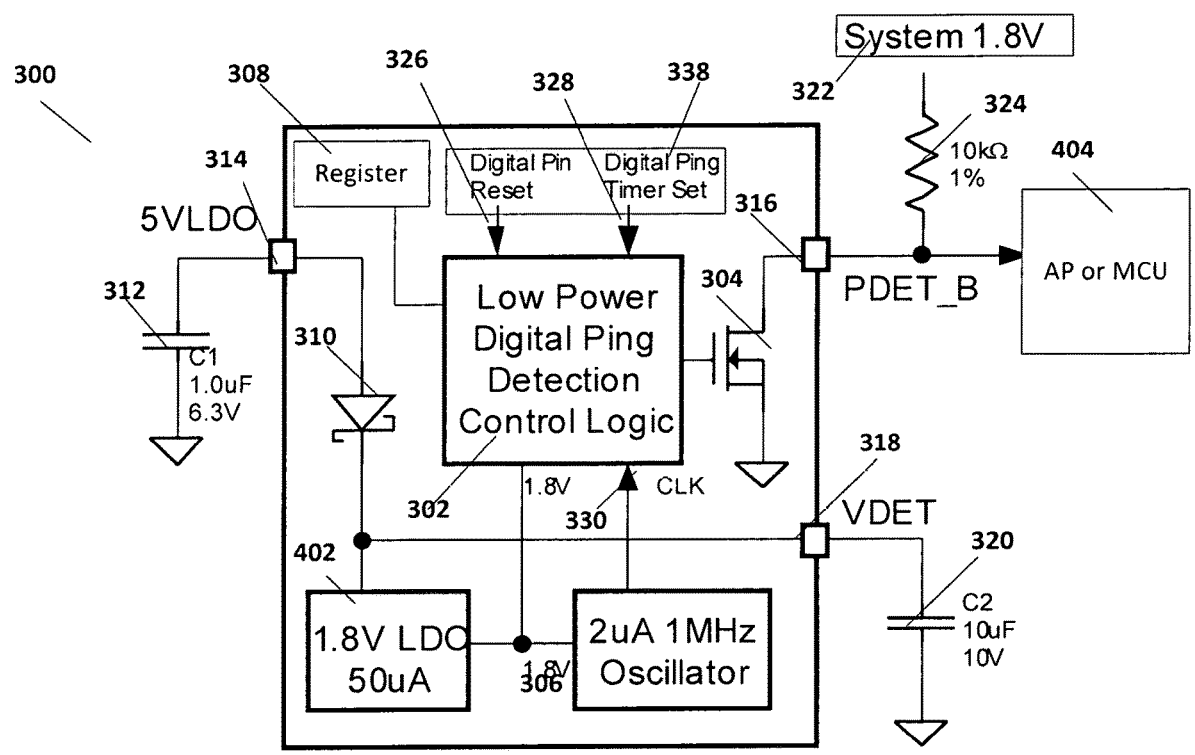
FIG. 4 illustrates an adaptive transmitter detection circuit according to some embodiments of the present invention.

FIG. 4 further illustrate aspects of a transmit detect circuit 300 according to embodiments of the present invention, which results in the same signals as illustrated in FIG. 3B. The adaptive Tx present detection circuitry 300 includes a low power logic circuit 302, a low power digital oscillator 306, and a register 308 as shown in FIG. 4. As is further illustrated, the example oscillator 306 is a 2 uA 1 MHz oscillator, although other oscillators can also be used. Capacitor C2 320 provides the power to the above mentioned circuitry 300. When receiver is first placed on a transmitter, 5VLDO powers up to provide signal 314 and charges the capacitor C2 320 to the voltage level that is close to the 5VLDO output voltage. Then the low power oscillator 306 and the low power digital logic circuit 302 work. At this moment, the digital ping interval register or MTP memory 308 is either pre-set by factory or set by AP (or a MCU) 404 after the receiver is up and operating.

When a battery is charged fully and an EPT(EOC) packet is sent to the transmitter, the transmitter turns off and starts a digital ping signal periodically. When the first digital ping signal is received, the time interval register or MTP memory 308 is reset based on this particular transmitter's ping interval time. The time is kept reset every time when digital ping is received until the first time that the digital ping signal is missing. Then PDET_B signal 316 goes high to tell an application processor (AP—or MCU) 404 that the transmitter is removed. FIG. 4 further illustrates a 1.8V LDO 402 that can also be powered by the voltage VDET 318.

If Tx is removed without detecting the first digital ping signal, the PDET_B signal 316 goes high once before the preset time expires. The preset time interval is required to be longer than that of the longest digital ping time interval of all anticipated transmitters.

As illustrated in the embodiments of FIGS. 3A and 4, a low power logic circuit 302 that is powered by the low power LDO providing voltage signal 314 and consumes low current (in uA range) during operation is provided. A low power oscillator 306 consuming low current (in uA range) during operation is also provided. An open-drain output to provide a PDET_B signal to an Application Processor (AP) or a Micro-Controller Unit (MCU) is further provided. An external energy storage component (capacitor) 320 to provide power to the above mentioned circuitry.

The capacitor 320 provides power to the low power logic circuit 302, low power oscillator 306, and the open-drain IO of transistor 304, which may provide a data signal to a GPIO circuit. The low power oscillator 306 provides a clock 330 to the low power logic circuit 302. The low power logic circuit 302 compares the time interval period based on the digital time interval from present transmitter and the preset time interval threshold to generate a logic signal to drive the open-drain IO circuit formed by transistor 304. The open-drain GPIO transistor 304 then provides PDET_B signal 316 to an AP or a MCU to inform the removal of a transmitter. Meanwhile, register 308 is updated to accommodate the timing interval of the transmitter pings from that transistor. FIG. 3B illustrates the key waveforms in the circuits illustrated in FIGS. 3A and 4, respectively.

The above detailed description is provided to illustrate specific embodiments of the present invention and is not intended to be limiting. Numerous variations and modifications within the scope of the present invention are possible. The present invention is set forth in the following claims.

What is claimed is:

1. A method of adaptively operating a transmit detection circuit, comprising:
   powering the transmit detection circuit with a capacitor charged by a low-dropout (LDO) regulator;
   receiving a digital ping signal from a transmitter;
   receiving a clock signal from a local oscillator;
   updating a register to accommodate timing of the digital ping signal; and
   generating a signal indicating whether the transmitter is present.

2. The method of claim 1, wherein updating the register includes setting the register to produce a digital ping timer set that is coordinated with the digital ping signal from the transmitter.

3. The method of claim 1, wherein generating the signal indicating whether the transmitter is present comprises
   determining that the digital ping signal has arrived prior to a digital ping timer signal; and
   setting a transistor to drive the signal to a first state indicating presence of the transmitter.

4. The method of claim 3, wherein generating the signal includes
   determining that no digital ping signal has arrived prior to the digital ping timer signal; and
   setting the transistor such that the signal is set to a second state indicating absence of the transmitter.

5. The method of claim 4, wherein the first state is a ground signal and the second state is a system voltage of 1.8 V.

6. A transmitter detection circuit, comprising:
   a low-dropout regulator that is powered when a digital ping signal is present;
   a capacitor coupled to receive power from the low-dropout regulator and supply a voltage;
   a control logic coupled to receive the voltage;
   a timing circuit coupled to a register and supplying a digital ping timing signal to the control logic;
   a clock circuit coupled to provide a clock signal to the control logic; and
   a transistor coupled to the control logic, the transistor being set to drive an output signal to a first state indicating presence of the digital ping signal if the digital ping signal arrives prior to the digital ping timing signal, the transistor being set to drive the output signal to a second state indicating absence of the digital ping signal if the digital ping timing signal arrives without a digital ping signal.

7. The transmitter detection circuit of claim 6, wherein the first state is a ground signal and the second state is a system voltage.

8. The transmitter detection circuit of claim 6, wherein the control logic adaptively adjusts the digital ping timing signal according to the digital ping signal.

\* \* \* \* \*